United States Patent
Chu et al.

(10) Patent No.: US 7,317,346 B2
(45) Date of Patent: Jan. 8, 2008

(54) SELECTING A BIAS FOR A LEVEL SHIFTING DEVICE

(75) Inventors: Daniel J. Chu, Folsom, CA (US); Raymond W. Zeng, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 12 days.

(21) Appl. No.: 11/076,970

(22) Filed: Mar. 11, 2005

(65) Prior Publication Data
US 2006/0202740 A1    Sep. 14, 2006

(51) Int. Cl.
*H02J 1/00*    (2006.01)
(52) U.S. Cl. ........................ 327/530; 327/538
(58) Field of Classification Search ............ None
See application file for complete search history.

(56) References Cited

U.S. PATENT DOCUMENTS

| | | | | |
|---|---|---|---|---|
| 4,469,959 A | * | 9/1984 | Luke et al. | 326/65 |
| 6,069,515 A | * | 5/2000 | Singh | 327/309 |
| 6,118,326 A | * | 9/2000 | Singer et al. | 327/390 |
| 6,344,815 B2 | * | 2/2002 | Ureshino | 341/144 |
| 6,504,418 B1 | * | 1/2003 | Coughlin, Jr. | 327/319 |
| 6,617,878 B2 | * | 9/2003 | Brownlow et al. | 326/68 |

* cited by examiner

*Primary Examiner*—N. Drew Richards
*Assistant Examiner*—An T. Luu
(74) *Attorney, Agent, or Firm*—Venable LLP; James R. Burdett; Marina V. Zalevsky

(57) ABSTRACT

One or more MOS devices may be used as a bias selecting circuit to pass a bias voltage from a bias generator to a level shifting circuit.

13 Claims, 3 Drawing Sheets

SELECTING A BIAS FOR A LEVEL SHIFTING DEVICE

BACKGROUND OF THE INVENTION

Ratio logic circuits may be used to implement small area level shifters. These circuits may generally have a device that is always on, but which may be designed to be weak. This device may be a PMOS device for positive voltage level shifters. A bias voltage may generally be provided to the gate of the PMOS device to turn it on (or off); this bias voltage may typically need to be higher to keep the PMOS device weakly on when a high supply voltage is applied to the source of the PMOS device, as opposed to when a low voltage is applied to the PMOS device. One or more NMOS devices may be added to pull an intermediate node (between the PMOS and NMOS device(s)) down to near-ground voltage if an input signal is on. The NMOS device (or devices) may generally be designed to be stronger than the PMOS device so that the intermediate node may be pulled down to (near) ground when both the PMOS and NMOS devices are both on. The voltage at the intermediate node may then be inverted to create an output signal.

Such ratio logic level shifters may often be connected such that a device may provide an input signal, and the output signal may be a voltage-shifted version of the input signal. One possible use of such level shifting is for testing purposes. For example, it may be desirable to sweep a level shifter output voltage across a device under test, which may be connected to the level shifter output, in order to measure certain characteristics of the device under test. In conjunction with the sweeping of the voltage, the bias voltage supplied to the PMOS device may need to be changed in accordance with the varying voltage level, to ensure proper functioning of the level shifter. Having to switch the bias voltage during the course of such testing may cause a delay in the testing process. This problem may be particularly acute in cases where there are many devices to be tested and/or where many tests are required.

BRIEF DESCRIPTION OF THE DRAWINGS

Various embodiments of the invention will now be described in connection with associated drawings, in which.

DETAILED DESCRIPTION OF EMBODIMENTS OF THE INVENTION

In the following description, numerous specific details are set forth. However, it is understood that embodiments of the invention may be practiced without these specific details. In other instances, well-known circuits, structures, and/or techniques have not been shown in detail in order not to obscure an understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Figure 1:
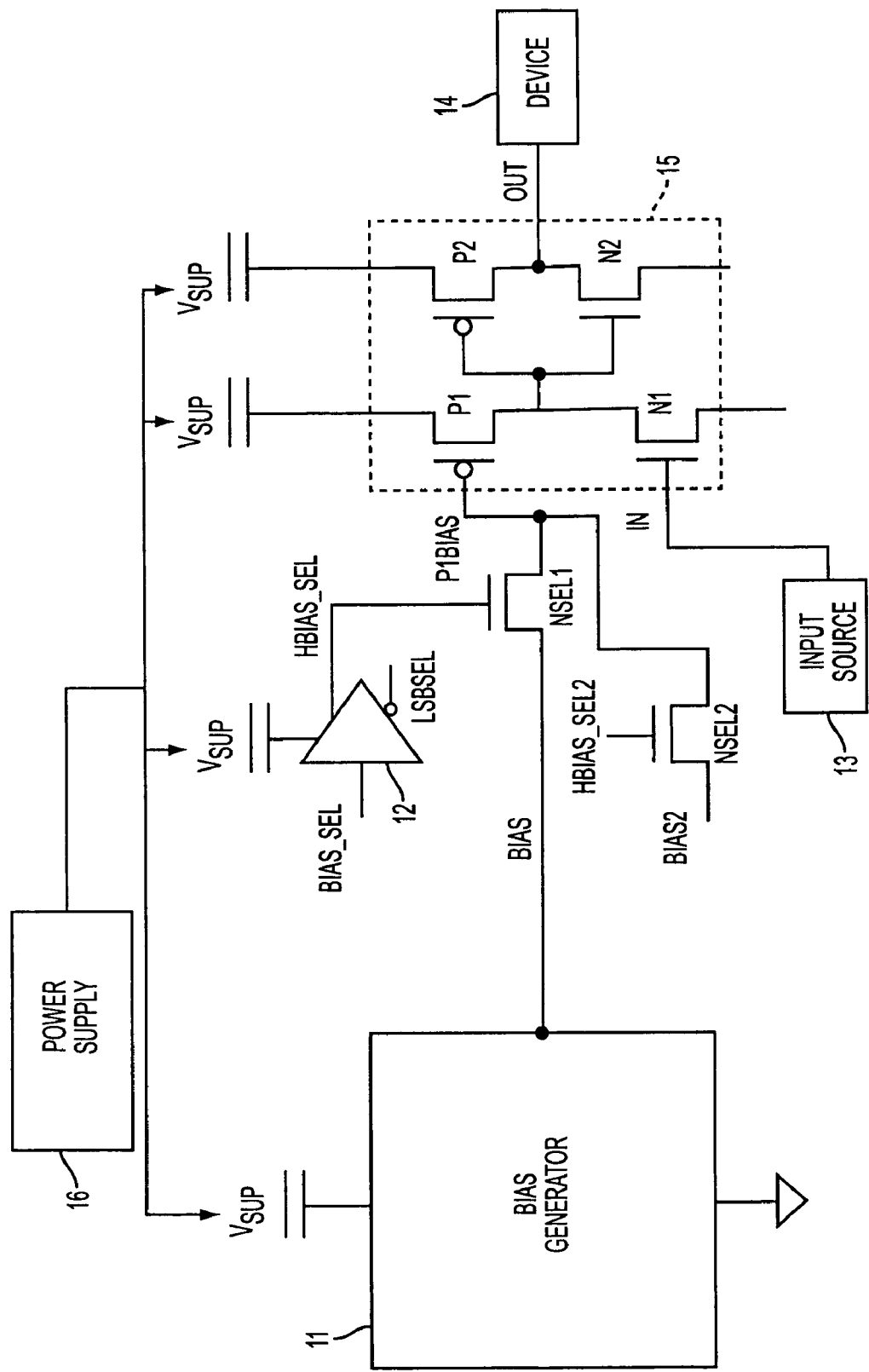
FIG. 1 depicts a schematic diagram of an apparatus and system according to an embodiment of the present invention.

FIG. 1 depicts a schematic diagram that includes an embodiment of the invention embedded in a system that includes a ratio bias level shifter 15 and a bias generator. In particular, the system of FIG. 1 may include a ratio bias level shifter circuit 15 that may comprise PMOS devices P1 and P2 and NMOS devices N1 and N2. It may be noted that this configuration may be used to perform positive level shifting, and one of ordinary skill in the art would understand that such a level shifter may be rearranged to perform negative level shifting (in conjunction with changing the biasing arrangement, supply voltage, etc., accordingly). In the configuration as shown, P1 and P2 may be connected to a supply voltage, $V_{SUP}$. An input signal may be applied to N1 from an input source device 13. Such a device 13 may be, for example, but is not limited to, a logic circuit or an address decoder. A bias voltage, P1BIAS, may be supplied to the gate of P1 to ensure that P1 is in a weak "on" state, in order to pass the input signal through the level shifting circuit 15 to produce an output signal, OUT.

The system of FIG. 1 may further comprise a bias generator 11. Bias generator 11 may be coupled to the same supply voltage, $V_{SUP}$, as the level shifting circuit 15. Bias generator 11 may generate a bias signal BIAS whose value may depend on the supply voltage, $V_{SUP}$.

The portion of the system shown in the center of FIG. 1, between bias generator 11 and the level shifting circuit 15, may comprise a bias selection circuit that may be used to provide bias voltage P1BIAS to PMOS device P1. The bias selection circuit may include at least one NMOS device NSEL1, which may have a bias selection signal HBIAS_SEL coupled to its gate, as shown. In the configuration shown, NSEL1 may pass bias voltage BIAS to P1BIAS as long as the voltage of HBIAS_SEL is greater than that of BIAS.

Bias selection signal HBIAS_SEL may be generated by a bias selection signal generator 12. Bias selection signal generator 12 may be coupled to the same supply voltage, $V_{SUP}$, as the other portions of the system and may also include an input voltage BIAS_SEL, which may serve to control bias selection signal generator 12. A control signal, LSBSEL, may be used to select whether to pass a voltage to the output of bias selection signal generator 12, HBIAS_SEL. In this manner, LSBSEL may be used to determine whether HBIAS_SEL will be generated at a level sufficient to pass bias voltage BIAS to P1BIAS and may, therefore, serve as a switching signal.

As discussed above, the various components of FIG. 1 may be coupled to the same supply voltage, $V_{SUP}$. This supply voltage may, in some embodiments of the invention, be supplied by an external power supply 16.

As previously discussed, the bias selection circuit may include multiple NMOS devices, in addition to NSEL1, either in series or in other configurations. Furthermore, multiple NMOS devices may be connected in parallel to permit the selection of one of several bias voltages to be passed to P1BIAS. For example, FIG. 1 shows a second NMOS device NSEL2 to which may be applied a second bias voltage, BIAS2, and a second bias selection signal, HBIAS_SEL2. By changing the voltages HBIAS_SEL and HBIAS_SEL2, BIAS or BIAS2 may be selected to be passed to P1BIAS.

As discussed above, a common application of the system of FIG. 1 may be for testing of a device 14. For example, to measure characteristics of some device (or devices) 14, for example, but not limited to, one or more flash cells, one may wish to sweep the supply voltage from a very low voltage, e.g., 0V, to a relatively high voltage, e.g., 10V (or vice versa). Using the system of FIG. 1, when the supply voltage is low, for example, but not limited to, 3V or less, bias generator 11 may generate a bias voltage, BIAS, that is low (e.g., close to ground). HBIAS_SEL may be generated by bias selection signal generator 12 to be, for example, 3V, which would suffice to pass BIAS to P1BIAS. When supply voltage, $V_{SUP}$, is higher, for example, above 11V, bias generator 11 may generate bias voltage BIAS at a higher level (e.g., 8V), and HBIAS_SEL may be generated by bias selection signal generator 12 to be at a level sufficient to pass BIAS to P1BIAS, which may thus permit passage of the higher $V_{SUP}$ level. In this fashion, the level of P1BIAS may be adjusted in accordance with the level of $V_{SUP}$ so that it may not be necessary to halt testing and switch from a high supply voltage mode to a low supply voltage mode, or vice versa. In other word, by having bias generator 11, bias selection signal generator 12, an NMOS device NSEL1 (which may be able to pass high or low voltages so long as the gate voltage is sufficiently higher than BIAS, the voltage being passed, which may be the case when the gate-to-bulk voltage of NSEL1 is greater than the drain-to-bulk voltage of NSEL1 plus the threshold voltage of NSEL1), and the level shifting circuitry 15 tied to a common supply voltage, $V_{SUP}$, it may be possible for the bias generator 11 to generate an output, BIAS, that depends on $V_{SUP}$ and for the other portions of the circuitry to similarly adjust so as to pass BIAS to the level shifting circuitry 15 (unless, of course, it is not to be passed). In fact, the arrangement of FIG. 1 may be able to pass a bias voltage of 0V if $V_{SUP}$ is set very low, which may obviate the need for a separate pull-down device to bring P1BIAS to 0V and may accordingly eliminate a need to reconfigure during the course of a voltage sweep.

Figure 2:
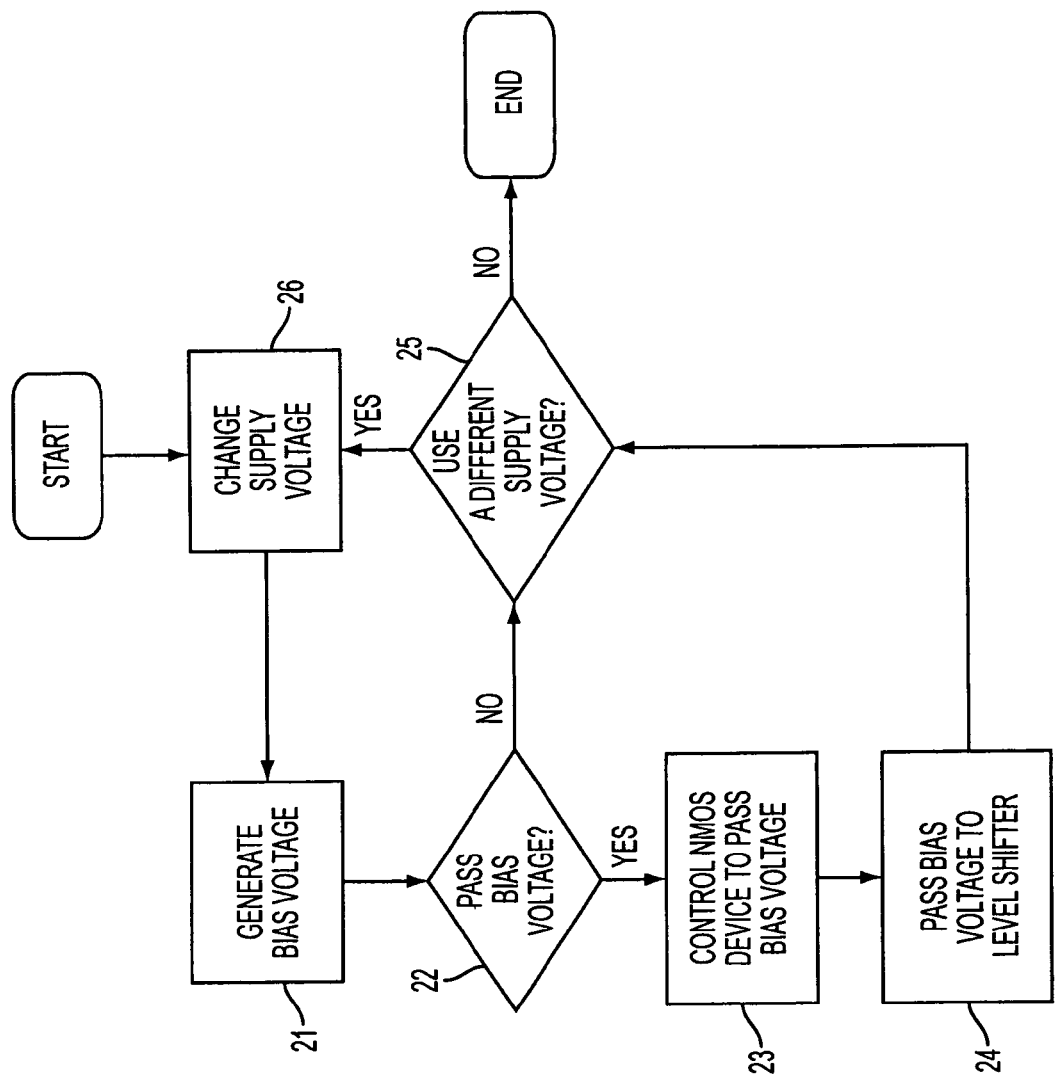
FIG. 2 depicts a flowchart illustrating an exemplary embodiment of a method according to an embodiment of the invention.

FIG. 2 presents a flowchart presenting a further exemplary embodiment of the invention, which also further discusses the above use in testing. As discussed above, a bias voltage may be generated 21. It may be determined whether the bias voltage will be passed or not (e.g., through an NMOS device, like NSEL1) 22. This decision may depend, for example, on whether a current device 14 is currently being chosen for testing or other purposes. If the bias voltage is to be passed, an NMOS device may be controlled to permit the bias voltage to pass through 23. The bias voltage may then be passed from BIAS to P1BIAS, the ratio bias for a level shifter 15, as shown in block 24. If it is determined that the bias voltage is not to be passed 22, the process may proceed further, as will be discussed below, or may end (not shown).

In some embodiments of the invention as shown in FIG. 2, the process may be a one-pass process, and in other embodiments it may be an iterative process. In the latter, case, the process may generally begin at the block marked "Start" and may set an initial supply voltage 26. Following the passing of the bias voltage to a level shifter 15 in block 24, as described in the previous paragraph, or if the bias voltage was determined not to be passed 22, the process may proceed to determine if there is a new supply voltage level to be used 25. If not, the process may end. If so, however, the process may continue by changing the supply voltage level 26 and proceeding to generate a new bias voltage 21.

Figure 1A:
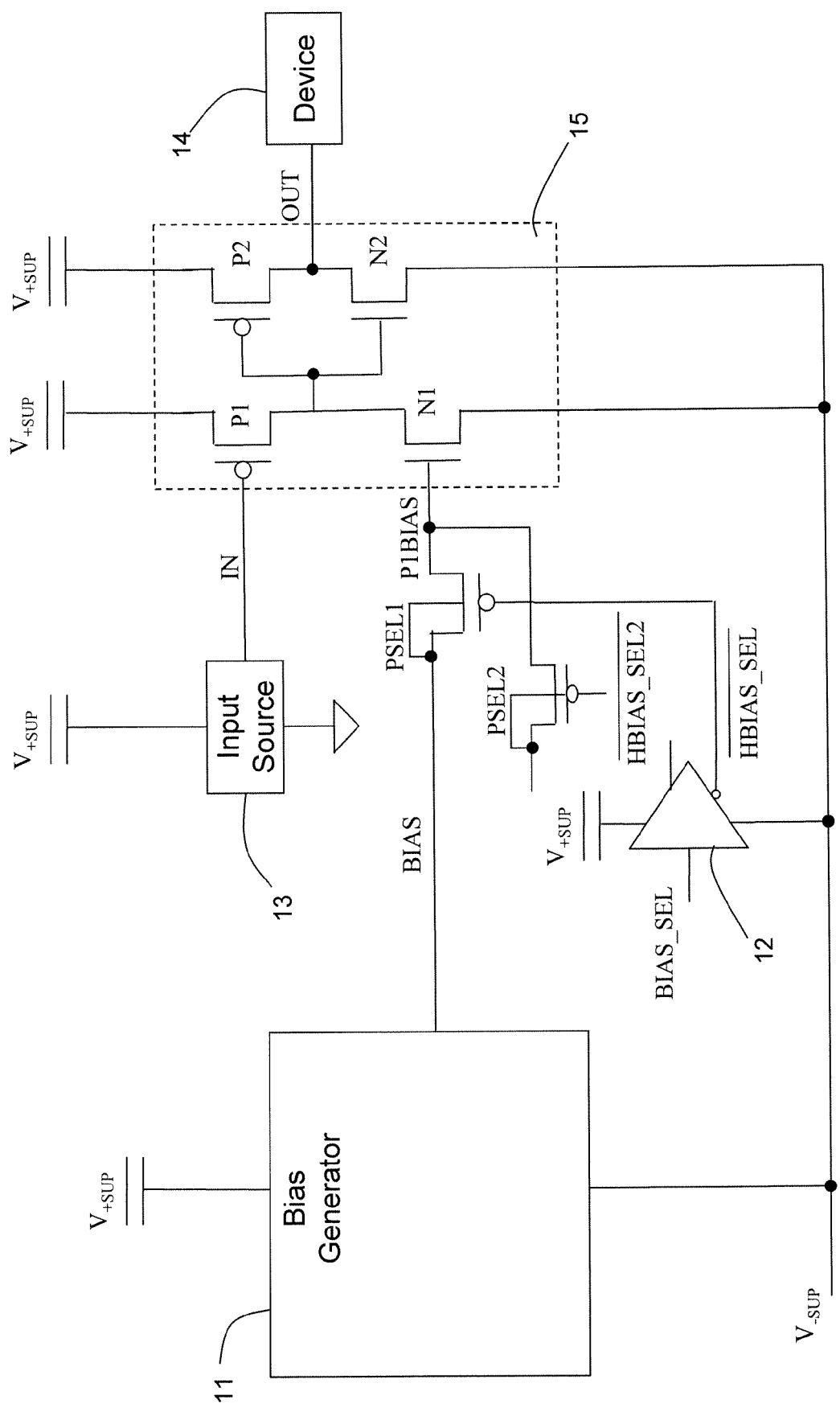
FIG. 1A depicts a schematic diagram of an apparatus and system according to an embodiment of the present invention.

It is noted that the above discussion has focused on the case in which positive voltages may be used. However, in the case where negative voltages may be used, a PMOS device may be substituted for NSEL1 (along with other corresponding changes to the circuit that may be made). The circuit may then operate in a similar fashion. An example of how the schematic diagram of FIG. 1 may be converted to use a PMOS device in such a fashion is shown in FIG. 1A.

Additionally, a PMOS device may be used in parallel with NSEL1 to accommodate certain special cases. For example, this arrangement may be used to pass the supply voltage, $V_{SUP}$, and to turn on all devices 13 in an array of circuits of the type shown in FIG. 1. This may result in all of the devices P1 being turned off and all of the devices N1 being turned on. Hence, this may be used to provide full CMOS logic without requiring static current.

The invention has been described in detail with respect to various embodiments, and it will now be apparent from the foregoing to those skilled in the art that changes and modifications may be made without departing from the invention in its broader aspects. The invention, therefore, as defined in the appended claims, is intended to cover all such changes and modifications as fall within the true spirit of the invention.

What is claimed is:

1. An apparatus, comprising:
   a level shifting device coupled to a variable supply voltage source and an input source device to respectively receive the supply voltage and an input signal and generate an output signal based at least on the input signal;
   a bias generator coupled to the variable supply voltage source to generate a varying bias voltage based on a value of the supply voltage;
   a signal generating device coupled to the bias generator and level shifting device, to receive the varying bias voltage and transmit the generated varying bias voltage based on a control voltage, the signal generating device including one of:
      an NMOS device to transmit the bias voltage of at least zero volts to a bias input of the level shifting device in response to the control voltage applied to a gate of said NMOS device, or
      a PMOS device to transmit the bias voltage of less than zero volts to a bias input of said level shifting device in response to the control voltage applied to a gate of said PMOS device; and
   a control voltage generator coupled to the supply voltage and signal generating device to generate said control voltage to be applied to respective one of said gate of said NMOS device or said gate of said PMOS device.

2. The apparatus according to claim 1, wherein said level shifting device comprises a ratio bias level shifter.

3. The system according to claim 1, wherein said input source device comprises at least one of:
   an address decoder, or a logic circuit.

4. The system according to claim 1, further comprising:
   a device to be tested coupled to the output of said level shifting circuit.

5. The system according to claim 4, wherein said device to be tested comprises a flash device.

6. An apparatus, comprising:
a bias generator coupled to a variable supply voltage source to generate first and second bias voltage levels different from one another based on a value of the supply voltage; and
a signal generating device including one of:
first and second NMOS devices, connected in parallel with one another, to transmit one of the first bias voltage of at least zero volts to a bias input of a level shifting device in response to a first control voltage applied to a gate of the first NMOS device or the second bias voltage of at least zero volts to a bias input of the level shifting device in response to a second control voltage applied to a gate of said second NMOS device, or
first and second PMOS devices connected in parallel to one another to transmit one of the first bias voltage of less than zero volts to a bias input of a level shifting device in response to a first control voltage applied to a gate of the first PMOS device or the second bias voltage of less than zero volts to a bias input of the level shifting device in response to a second control voltage applied to a gate of said second PMOS device; and
a control voltage generator to generate the first and second control voltages to be applied to one of (a) a respective gate of the first or second NMOS device or (b) a respective gate of the first or second PMOS device.

7. The apparatus according to claim 6, wherein said bias generator and level shifting device are coupled to a common supply voltage.

8. A system, comprising:
an external power supply to provide a variable supply voltage;
a bias generator coupled to the external power supply to generate a varying bias voltage based on a value of the supply voltage;
a level shifting circuit, coupled to the variable supply voltage, the level shifting device having a bias input to receive the bias voltage and generate an output signal based at least on the received bias voltage; and
a signal generating device coupled to the bias generator and level shifting circuit to receive the generated bias voltage and transmit the received voltage to a bias input of the level shifting circuit based on a value of a control voltage, the signal generating device including one of:
an NMOS device to transmit the bias voltage of at least zero volts to the bias input in response to the control voltage applied to a gate of the NMOS device, or
a PMOS device to transmit the bias voltage of less than zero volts to the bias input in response to the control voltage applied to a gate of the PMOS device.

9. A method comprising one of:
(a) generating a bias voltage of at least zero volts based on a voltage level of a variable supply voltage; and
controlling an NMOS device to permit the bias voltage of at least zero volts to pass to a bias input of a level shifting circuit coupled to the variable supply voltage; or
(b) generating a bias voltage of less than zero volts based on a voltage level of a variable supply voltage; and
controlling a PMOS device to permit the bias voltage of less than zero volts to pass to a bias input of a level shifting circuit coupled to the variable supply voltage.

10. The method according to claim 9, wherein controlling of the NMOS device or the PMOS device is performed without reconfiguration, respectively, of said NMOS device PMOS device while the voltage level of the variable supply voltage is swept over a range of voltages between a high level and a low level or a low level and a high level.

11. The method according to claim 9, further comprising:
generating a control voltage; and
applying said control voltage respectively to one of a gate of said NMOS device or a gate of said PMOS device.

12. The method according to claim 9, further comprising:
coupling an output signal from said level shifting circuit to an input of a device to be tested.

13. The method according to claim 12, wherein said device to be tested comprises a flash device.

* * * * *